United States Patent [19]

Bashaw

[11] Patent Number: 4,567,593
[45] Date of Patent: Jan. 28, 1986

[54] APPARATUS FOR VERIFICATION OF A SIGNAL TRANSFER IN A PRESELECTED PATH IN A DATA PROCESSING SYSTEM

[75] Inventor: Lawrence D. Bashaw, Phoenix, Ariz.

[73] Assignee: Honeywell Information Systems Inc., Phoenix, Ariz.

[21] Appl. No.: 539,356

[22] Filed: Oct. 6, 1983

[51] Int. Cl.[4] .............................................. G06F 11/00
[52] U.S. Cl. ....................................... 371/25; 371/16; 324/73 AT
[58] Field of Search ..................................... 371/15–16, 371/21–22, 24–25, 28; 324/73 R, 73 AT

[56] References Cited

U.S. PATENT DOCUMENTS

| | | | |
|---|---|---|---|
| 3,579,199 | 5/1971 | Anderson et al. | 371/21 X |
| 3,751,649 | 8/1973 | Hart, Jr. | 371/21 X |
| 3,940,601 | 2/1976 | Henry et al. | 371/21 X |
| 4,039,814 | 8/1977 | Saint-Hilaire et al. | 371/15 X |
| 4,300,234 | 10/1981 | Maruyama et al. | 371/21 X |
| 4,335,457 | 6/1982 | Early | 371/28 |
| 4,482,953 | 11/1984 | Burke | 371/25 X |
| 4,503,536 | 3/1985 | Panzer | 371/25 |
| 4,503,537 | 3/1985 | McAnney | 371/25 |

Primary Examiner—Gary V. Harkcom
Attorney, Agent, or Firm—A. A. Sapelli; J. S. Solakian; L. J. Marhoefer

[57] ABSTRACT

A specialized circuit set is included in a data processing system wherein the circuit set registers can be configured into a serial array. A clock signal distribution system delivers controlled clock signals to selected serial arrays. A maintenance data processor provides predetermined signal groups and addressing apparatus responsive to the predetermined signal groups loads and unloads register arrays in response to the predetermined signals. A predetermined signal group is entered into the serial register array, a predetermined number of clock cycles are applied, and the resulting signals shifted from the serial register array are applied to the maintenance data processor for display or analysis. By comparing the expected result for a given initial state with the actual result of an operation sequence, the accuracy of the operation of the data processing system, or any portion thereof, is thereby determined.

3 Claims, 12 Drawing Figures

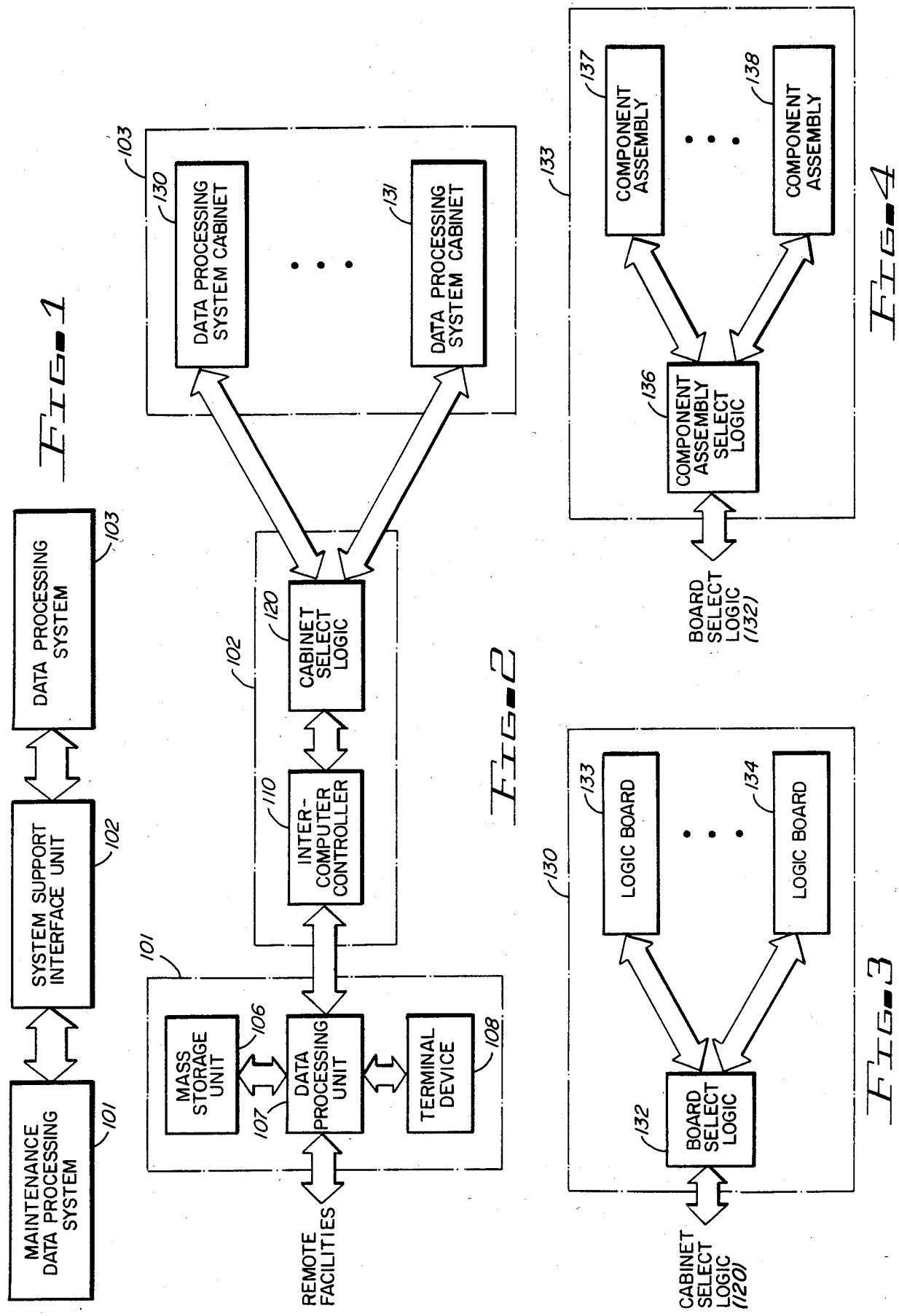

APPARATUS FOR VERIFICATION OF A SIGNAL TRANSFER IN A PRESELECTED PATH IN A DATA PROCESSING SYSTEM

BACKGROUND OF THE INVENTION

1. Field of the Invention

This invention relates generally to data processing systems and more particularly to apparatus and methods for maintenance and for verification of the accuracy of the operation of data processing systems. With the disclosed apparatus, the data processing system can be initialized to any arbitrary predetermined state, a selected sequence of operation can be executed, and the resulting state of the data processing system can be determined. Using this apparatus the transfer of a data signal over a preselected path during a single clock period can be verified.

2. Description of the Related Art

It is known in the related art to provide a program which utilizes the preselected path. The accuracy of the results of execution of the program are examined to determine if an error is present. If an error is present, then determination must be made if the error is the preselected path.

The prior art suffers rom the fact that it is generally impossible to isolate the preselected path. Other data signal paths coupled to the preselected can make the data signal propagation along the preselected path. In addition, errors can arise from sources other than data signal transfer during a single clock path that can complicate analysis.

SUMMARY OF THE INVENTION

It is an object of the present invention to provide an improved test and maintenance apparatus for a data processing system.

It is another object of the present invention to provide test and maintenance apparatus capable of determining if a data signal can be propagated along a preselected path in a single clock period.

It is yet another object of the present invention to provide test and maintenance apparatus capable of entering predetermined signals in register positions of a data processing system, operating the data processing system for a single clock period, and then examining the contents of a terminating register cell to determine if a data signal has propagated along the preselected path.

It is a further object of the present invention to provide test and maintenance apparatus capable of controlling the clock of a data processing system so that operation of the data processing system can be controlled and operation of a preselected path can be verified.

It is a still further object of the present invention to provide test and maintenance apparatus for testing a preselected data signal path capable of entering predetermined signals in the registers of a data processing system, performing a pre-established operation by the data processing system, and analyzing the resulting signals of the data processing system wherein predetermined signals are entered in register cells coupled to a preselected path in order to isolate the operation of the preselected path.

The aforementioned and other objects of the present invention are obtained by a maintenance processor capable of applying predetermined signal groups, registers in the data processing system capable of being configured into a serial array in response to the maintenance processor signals, interface circuits capable of addressing and shifting logic signals into and out of the serial register arrays and a clock signal distribution system responsive to the maintenance processor signals capable of controlling the clock signals applied to each component.

This apparatus can be used to enter pre-established logic signals in a portion or into all of the cells of a register. Because the clock signals are controllable, the data processing unit can perform a predetermined operation or sequence of operations on the pre-established signals. The contents of the registers resulting from the operation(s) can then be withdrawn from the registers in order to verify the accuracy of the signal manipulation by the data processing system.

In order to verify the operation of preselected paths in the data processing system, signals are entered in a register cell at the beginning of the preselected path and at the termination of the preselected path wherein the signal in the register cell terminating the preselected path will change logic states during normal operation. Register cells coupled to the preselected path and register cells influencing the coupled register cells have signals entered therein preventing interruption with the preselected path during the period of operation.

These and other features of the invention will be clear upon reading of the specification along with the figures.

BRIEF DESCRIPTION OF THE DRAWINGS

FIG. 1 is a block diagram of a data processing system and associated test and maintenance apparatus according to the present invention.

FIG. 2 is a block diagram of a data processing system elements and associated test and maintenance apparatus elements.

FIG. 3 is a block diagram of the elements of a data processing system cabinet according to the present invention.

FIG. 4 is a block diagram of the elements of a logic board according to the present invention.

DETAILED DESCRIPTION OF THE FIGURES

Figure 5:
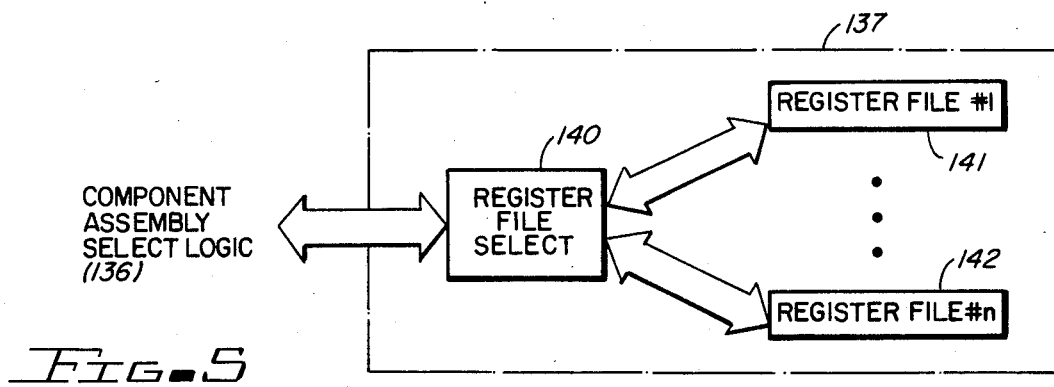
FIG. 5 is a block diagram of a portion of the elements of a component assembly used by the test and maintenance apparatus.

Referring first to FIG. 1, the maintenance data processing system 101 exchanges signals with the system support interface unit 102. The system support interface unit 102, in turn, exchanges signals with the data processing system 103.

Referring next to FIG. 2, the maintenance data processing system 101 comprises a mass storage unit 106 coupled to a data processing unit 107. The data processing unit 107 is also coupled to remote facilities, terminal device 108, and to the system support interface unit 102, and more specifically to the inter-computer controller 110. The system support interface unit 102 also includes cabinet select logic 120 which is coupled to the inter-computer controller 170. The data processing system 103 is divided into a plurality of data processing system cabinets 130 through 131 and each of the data processing system cabinets are coupled to the cabinet select logic 120.

Referring to FIG. 3, the data processing system cabinets 130 through 131 each include board select logic 132 and logic boards 133 through 134. The board select logic 132 is coupled to the cabinet select logic 120 of the system support interface unit 102.

Referring to FIG. 4, the logic boards 133 through 134 are comprised of a component assembly select logic 136, which is coupled to the board select logic 132 and a plurality of component assemblies 137 through 138. The component assembly select logic 136 is coupled to the component assemblies 137 through 138.

Referring to FIG. 5, each component assembly 137 through 138 having registers with a plurality of files is comprised of register file select logic 140 associated with each register memory files and a plurality of associated register file #1 141 through register file 142. The register file select logic 140 is coupled to the register file #1 141 through register file #n 142 and to the component assembly select logic 136.

Figure 6:
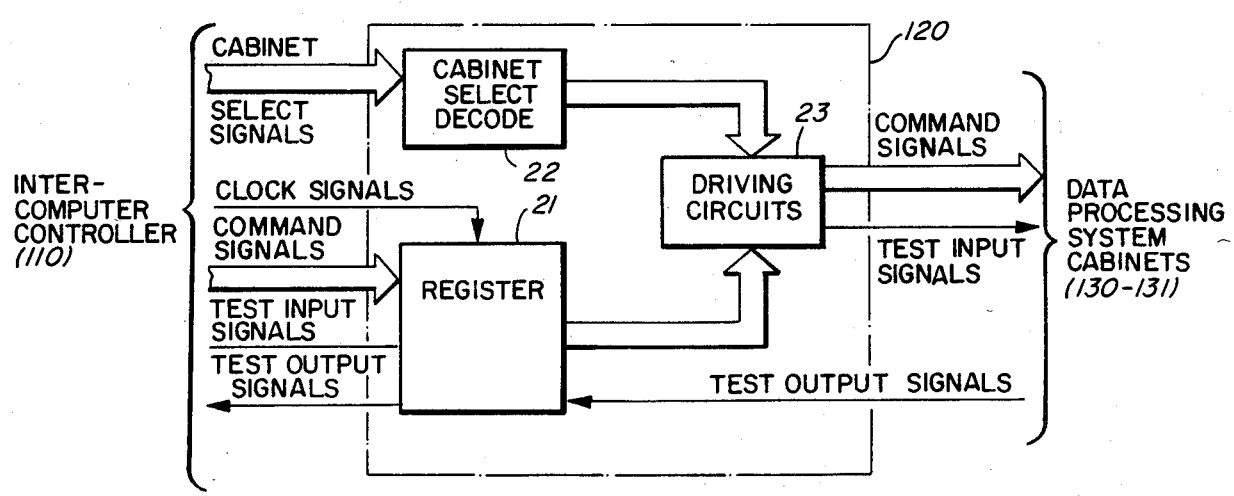
FIG. 6 is a block diagram of the elements of the cabinet select logic according to the present invention.

Referring next to FIG. 6, the cabinet select logic 120 is comprised of cabinet select decode apparatus 22, driving circuits 23, and register 21. The cabinet select decode apparatus 22 receives cabinet select signals from the inter-computer controller 110. The output of the cabinet select decode apparatus 22 is coupled to the driving circuits 23. Register 21 receives clock signals, command signals and test input signals from the inter-computer controller 110. Register 21 also supplies test output signals to the inter-computer controller. Register 21 provides command signals and test input signals to driving circuits 23 and register 21 receives test output signals from the data processing system cabinets 130 through 131. The driving circuits 23 supply command and test input signals to the data processing system cabinets 130 through 131.

Figure 7:
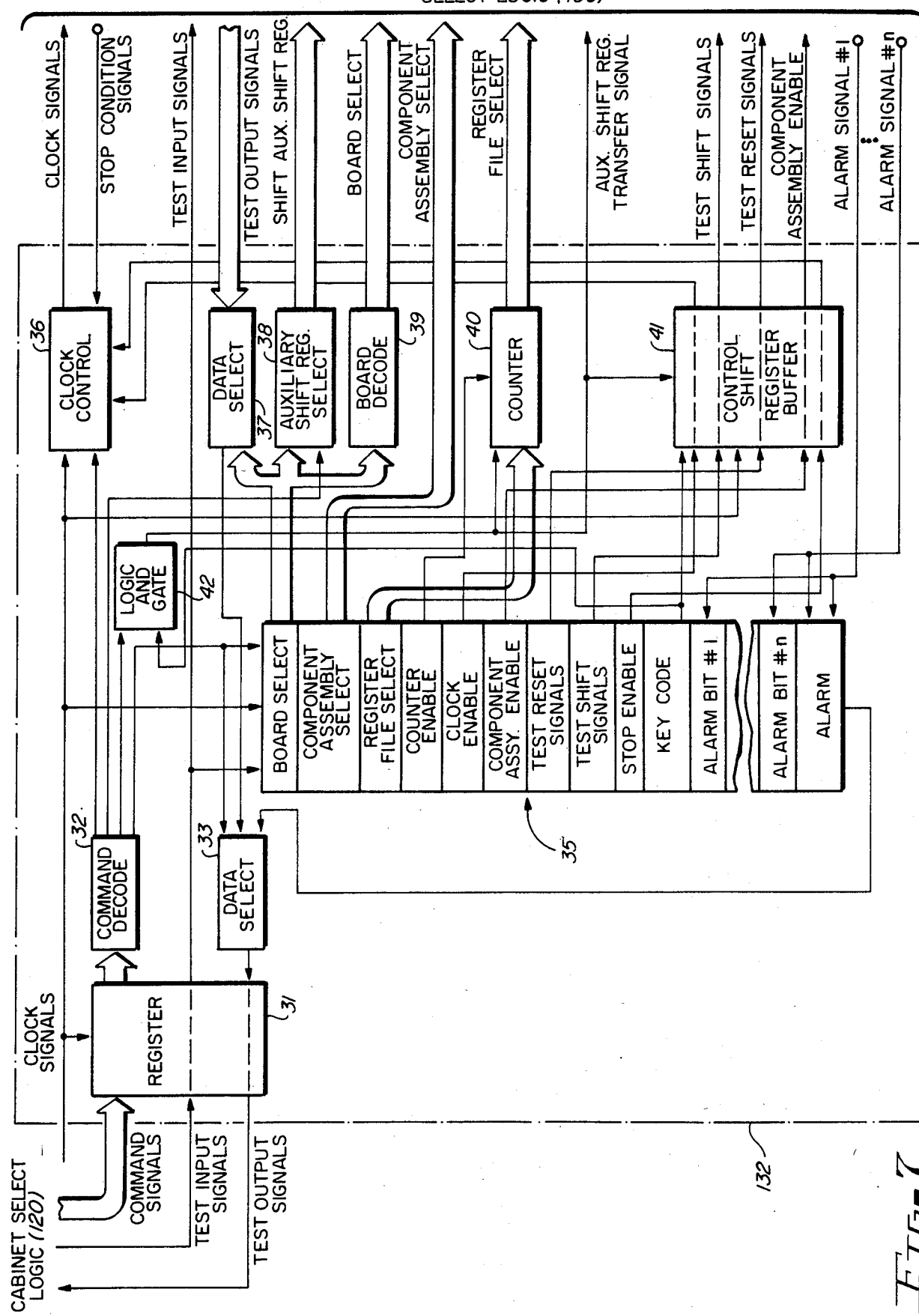
FIG. 7 is a block diagram of the board select logic used by the test and maintenance apparatus.

Referring next to FIG. 7, a detailed block diagram of the board select logic 132 is shown. The board select logic 132 is comprised of register 31, command decode logic circuits 32, data select logic 33, control shift register 35, clock control 36, data select logic 37, auxiliary shift register select logic 38, board decode logic 39, counter circuit 40, and control shift register buffer 41. Register 31 receives command signals, clock signals, and test input signals from the cabinet select logic 120 and provides test output signals to the cabinet select logic 120. The test input signals includes signals for storage in the auxiliary shift register. Similarly, the test output signals includes signals for the auxiliary shift register output and the alarm apparatus. The specific signal group transferred over by these electrical coupling members is controlled by the data processing unit 107. Register 31 applies command signals to command decode logic 32, which in turn, applies signals to control shift register 35, to clock control 36, to data select logic 33, to an input terminal of logic AND gate 42, and to auxiliary shift register select logic 38. Register 31 applies test input signals to control shift register 35 and to the logic boards 133 through 134, and register 31 receives test output signals from data select logic 33. Data select logic 33 receives signals from an alarm signal position (i.e. the most significant bit) of the control shift register 35 and from data select logic 37. The control shift register 35 applies signals from a board select portion of the register to the board decode logic 39, to the auxiliary shift register select 38, and to data select logic 37. Control shift register 35 applies signals from a register file select portion of register 35 and from and a control enable portion of register 35 to counter 40. Signals from a clock enable portion of the control shift register 35, component assembly enable portion of register 35, a test reset signal portion of register 35, a test shift signal portion of register 35, and a stop enable portion of register 35 are applied to shift control register buffer 41. Clock control logic 36 receives system clock signals, receives clock control signals from command decode logic 32, receives signals from control shift register buffer 41, and receives stop condition signals from the cabinet logic. Clock control logic 36 applies clock signals to the logic boards. Data select logic 37 receives test output signals from the logic boards. Board decode logic 39 applies board select signals to the logic boards. Counter 40 applies register file select signals to the logic boards while control shift register buffer 41 applies component assembly enable signals, test reset signals and test shift signals to the logic boards. The component assembly select portion of the control shift register applies component assembly select signals to the logic board. The test output signal from each of the component assemblies is also applied to a related alarm bit position of the control shift register 35 and all of the signals are applied to an alarm (most significant bit) position of the control shift register. The control shift register 35 includes a plurality of register positions which serve the function of a key code. These register positions are coupled to a second input terminal of logic AND gate 42. An output terminal of logic AND gate 42 is coupled to counter 40, to the auxiliary shift registers (i.e. providing transfer signals) and to control shift register buffer 41.

Figure 8:
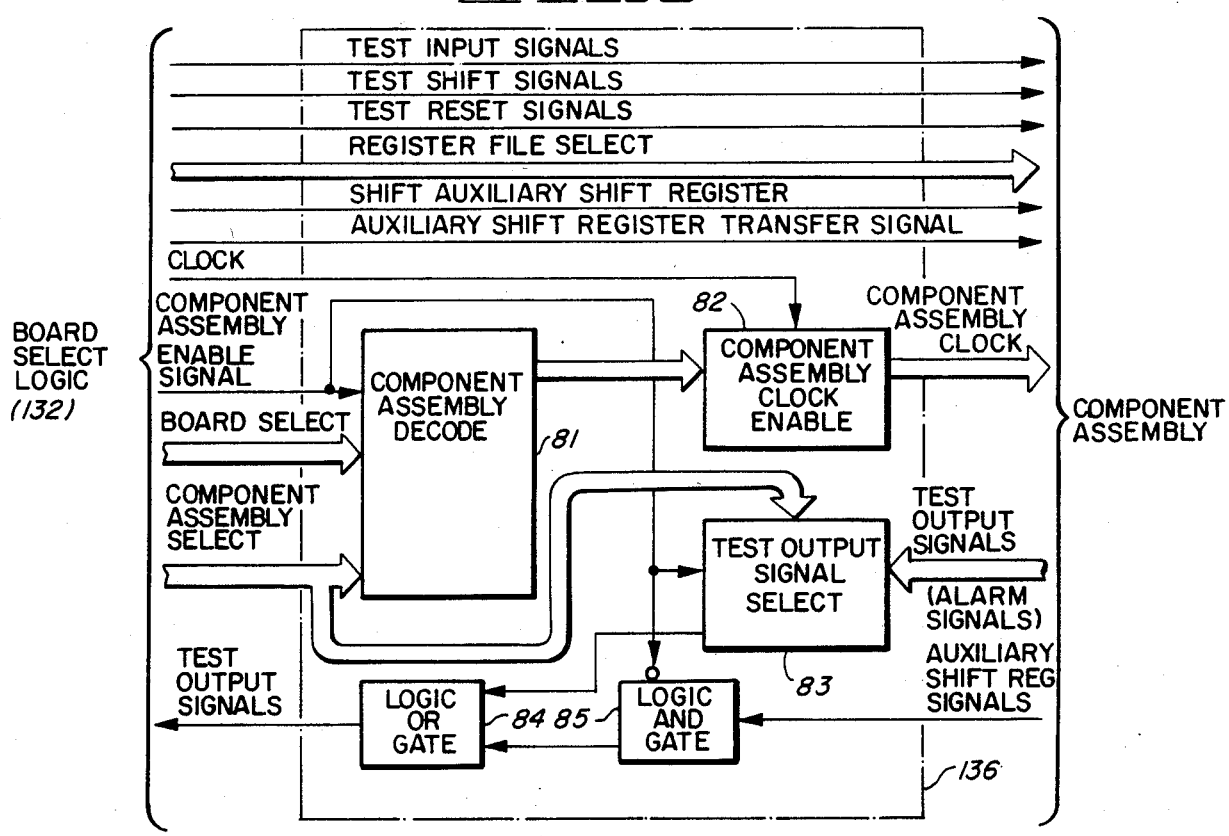
FIG. 8 is a block diagram of the component assembly select logic used by the test and maintenance apparatus.

Referring to FIG. 8, the component assembly select logic 136 is shown. The test reset signals, the test shift signals, the register file select signals, the auxiliary shift register transfer signal and the shift auxiliary shift register signals are received from board select logic 132 and applied to the component assemblies. Component assembly decode logic 81 receives component assembly enable signals, board select signals and component assembly select signals. Component assembly clock logic 81 applies signals to the component clock enable logic 82. Component assembly clock enable logic 82 also receives clock control signals, and this logic applies signals to the component assembly clock apparatus. Test output signal select logic 83 receives component assembly select signals, test output signals, and component assembly enable signals and applies signals to logic OR gate 84. Logic OR gate 84 receives signals from logic AND gate 85 and from test output signal select logic 83 and applies test output signals to board select logic 132. Logic AND gate 85 receives inverted component assembly enable logic signals and auxiliary shift register output signals from the component assemblies.

Figure 9:
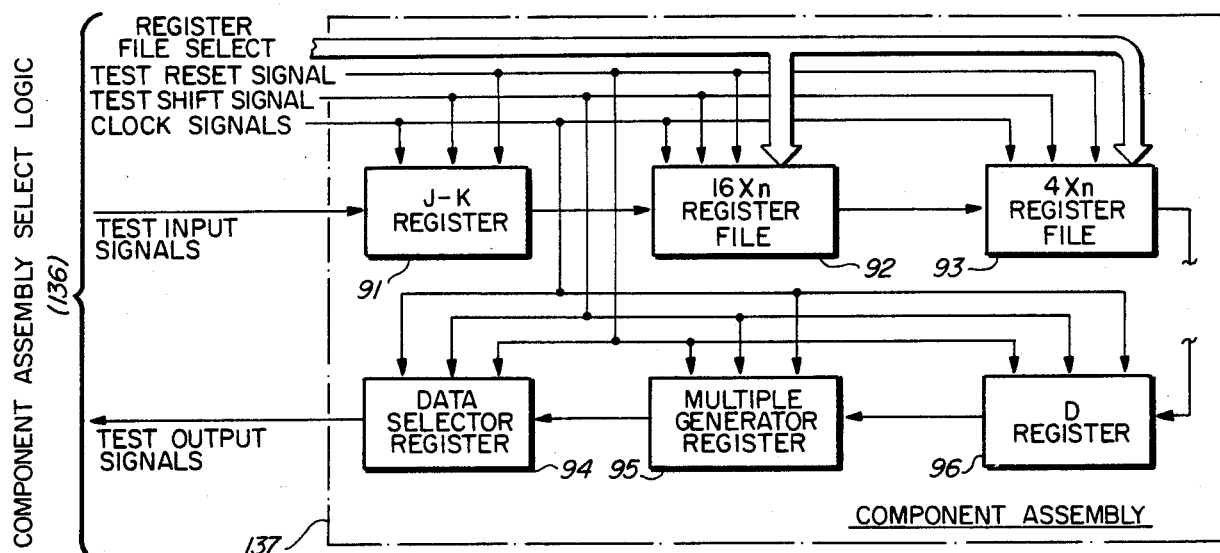
FIG. 9 is a block diagram of a portion of an exemplary component assembly according to the instant invention.

Referring next to FIG. 9, a block diagram of a partial configuration of the registers for an exemplary component assembly is shown. The component assembly is comprised of J-K register 91, 16×n register file 92, 4×n register file 93, D register 96, multiple generator register 95 and data selector register 94. Applied to each register are test reset signals, test shift signals and clock signals. For those register elements that include a plurality of register files, register file select signals are also applied. The registers are arranged sequentially so that test input signals are applied to the arbitrarily assigned first register of the sequence, (i.e. J-K register 91 in FIG. 9) and the test output signals are received from the last register of the component assembly (i.e. data selector register 94). All of the other registers and register elements can be coupled sequentially in the component. As will be clear, only the test connections for the registers are shown. The connections for the normal operation of the data processing system and the multiplicity of elements between the register cells are not shown.

Figure 10:
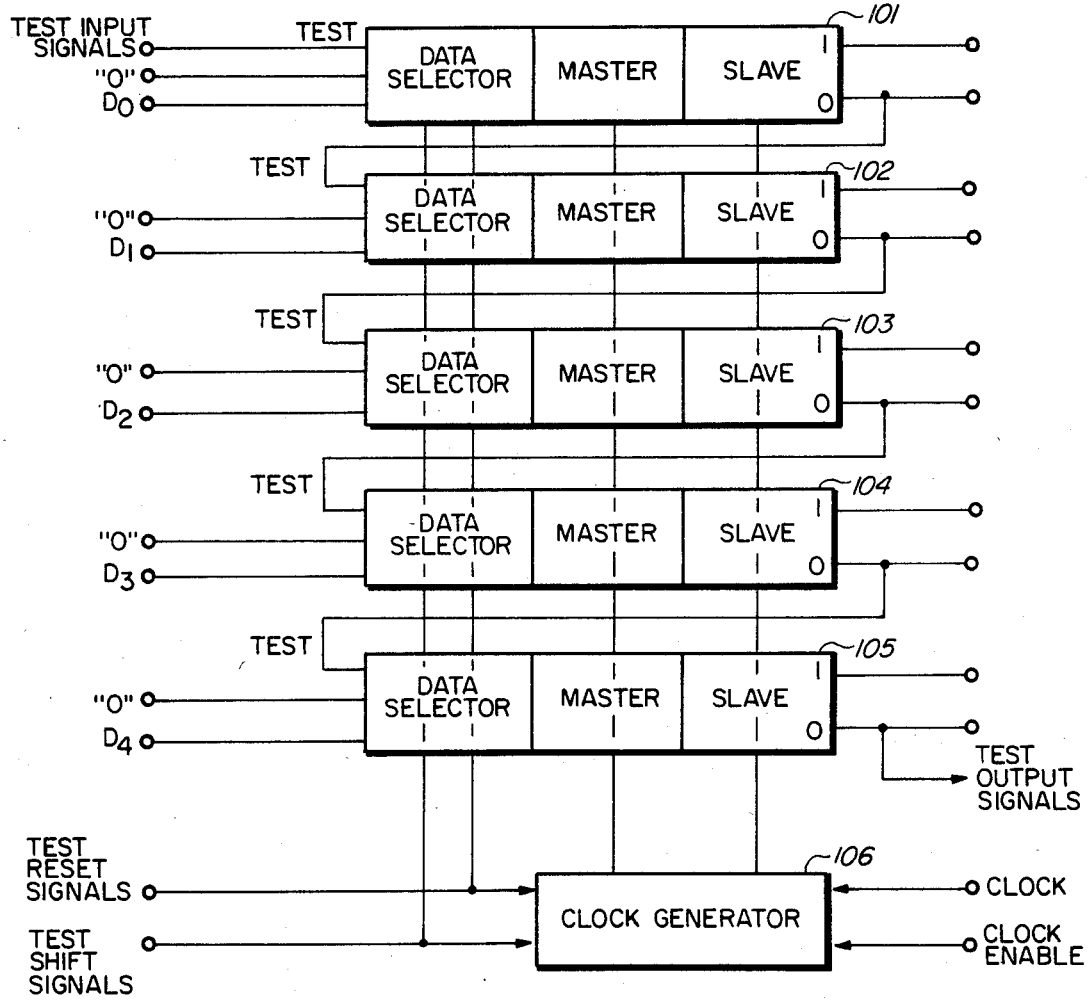
FIG. 10 is a block diagram of an exemplary "D" register of the type capable of use with the present invention.

Referring to FIG. 10, a typical D register, according to the present invention is shown. The D register is comprised of register elements 101 through 105 and clock generator logic 106. Each register element includes a data selector portion, a master portion coupled to the data selector portion and a slave portion coupled to the master portion. Each data select portion has three input terminals, a logic "O" signal terminal, a "D" data terminal and test terminal. The data selector selects one signal input mode based on the test reset and test shift signals applied to the data selection portion of the register elements. The slave portion of each register element has a signal output terminal and an inverted signal output terminal. The inverted output signal terminals are coupled to the test terminal of the data selector of the succeeding register element. The inverter output signal terminal of the last register element provides test output signals, while the test input terminal of the first register element receives test input signals. The clock enable logic 106 receives test reset signals, test set signals, clock signals and clock enable signals. The clock enable logic has a first terminal coupled to all of the master portions of the register elements and a second terminal coupled to all of the slave portions of the register elements.

Figure 11:
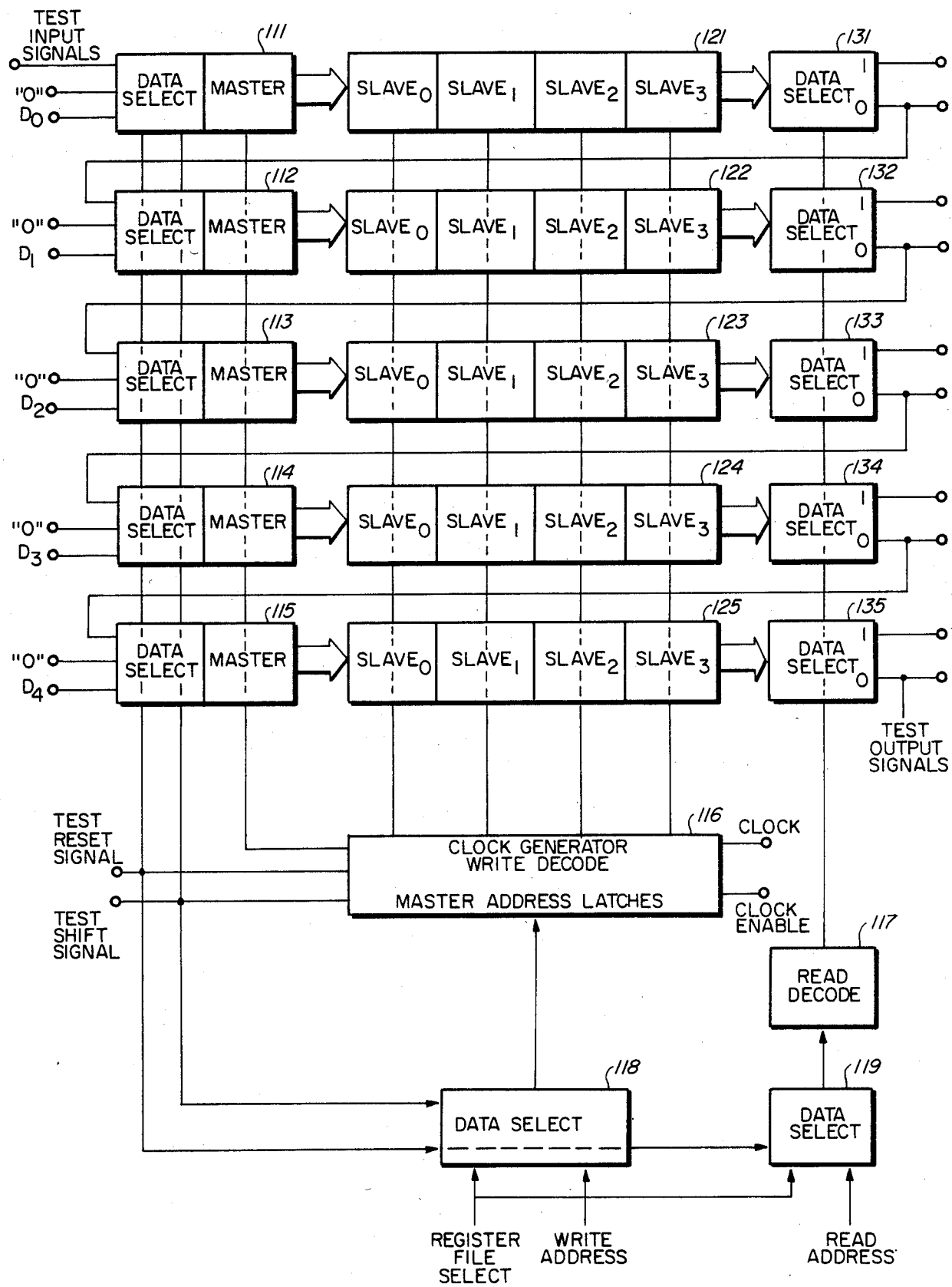
FIG. 11 is a block diagram of an exemplary 4×5 "D" register file of the type capable of use with the present invention.

Referring to FIG. 11, a typical 4×5 D input register file according to the present invention is shown. The register includes five groups of elements, clock generator, write decode and master address latch logic 116, a data select 118, a read decode logic 117 and data select 119. Each register element group includes a data select portion and master portion (111-115), a slave portion with four positions (121-125) and a data select portion (131-135). The data select portions of register elements 111-115 have input terminals for test signals, for "O" signals and for data i.e. "$D_0$"-"$D_4$" signals. The data select portion is coupled to the master portion of the registers. The register master portions 111-115 are coupled to the four-position slave portions 121-125 respectively. The four-position slave portions 121-125 are coupled to data select portions 131-135 respectively. Each data select portion has two output terminals, a signal output terminal and an inverted signal output terminal. The inverted signal output terminal of each register element is coupled to the succeeding test input signal terminal of data select input terminals, i.e. the inverted logic signal position of data select 131 is coupled to the to the data input terminal of data select 112.

The test signal terminal of register portion 111 is coupled to the test input signals, while the inverted logic signal output terminal of data selector 135 provides the test output signals. Test reset signals and test shift signals are applied to the input data select register portions 111-115, to clock generator, write address decode, master address latches logic 116, data select logic 118 and data select logic 118. Data select logic 118 also receives register file select signals and write address signals. Data select 119 also receives register file select signals and read address signals and applies signals to read decode logic 117. Read decode logic applies signals to data (word) select logic portions 131-135 of the registers. Clock generator, write address and master address latches logic 116 also receive clock signals, clock enable signals, and signals from data select logic 118 and applies signals to each master portion of elements 111-115 and applies signals to each of the slave positions in register slave portions 121-124.

Figure 12:
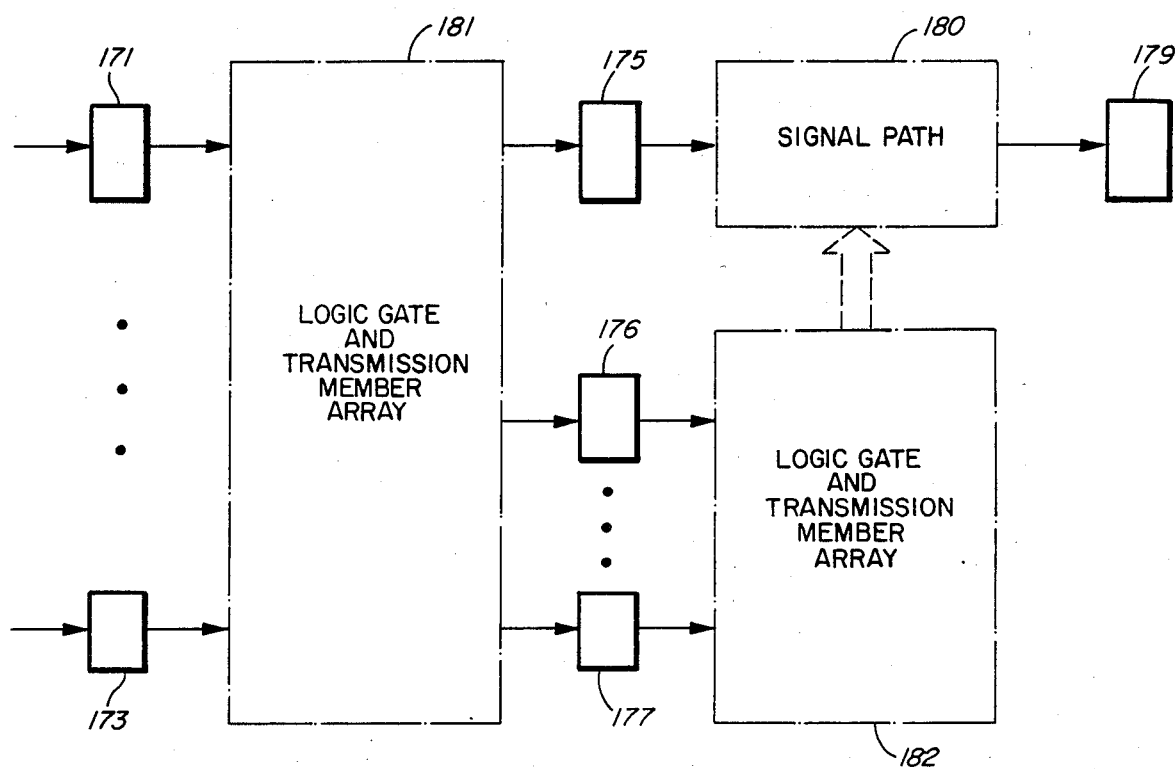
FIG. 12 is a block diagram of apparatus arranged to test the operation of a preselected data path in a data processing system.

Referring to FIG. 12, a block diagram illustrating the use of the test and maintenance apparatus to determine if a preselected signal path is capable of accurate operation, i.e. transfer of a signal from a first register cell to a second register cell during a single clock period. The preselected signal path is designated by element 180. Element 180 couples a data signal originating register cell 175 with a data signal terminating register cell 179 and can include logic components transmission line, media delay and any physical influence causing a delay in signal propagation from register cell 175 to register cell 179. Register cells 176 through 177 are register cells whose signals can effect the preselected signal path 180 through logic gate and transmission member array 182. Register cells 171 through 173 are coupled to register cells 175 and 176 through 177 through logic gate and transmission member array 181.

OPERATION OF THE PREFERRED EMBODIMENT

The test and maintenance system of the invention involves four categories of components. The maintenance components, together with appropriate storage devices and terminal devices, executes routines necessary to interface with the test and maintenance system and provide the programs to initialize the state of the data processing systems to determine the state of test apparatus at an arbitrary point in the operation of the data processing system and to provide specialized test capability. In the preferred embodiment, this portion of the system is also coupled to remote control and data processing facilities thereby permitting the maintenance and diagnostic processes to be performed remotely from the data processing system.

The intercomputer controller couples the maintenance computer and the test apparatus to the data processing system. The intercomputer controller contains registers for serialization and deserialization of data as well as programmable counters to facilitate the data conversion.

The system test apparatus consists of the apparatus between the intercomputer controller and the register or register files of the component assemblies that can be initialized and unloaded. The system test apparatus is closely integrated with the distribution of clock signals. The test system of the instant invention utilizes clocking for the apparatus that can be stopped or started and restricted to the target component under control of the test program. The system test apparatus provides for target clock addressing down to the component assembly level.

The fourth group of apparatus is the custom circuit family associated with the component assemblies. The register design in the preferred embodiment are edge-triggered master/slave register implementation. These registers include data select logic before the master latch that can select normal input data, configure the register as a shifting apparatus or reset the register by placing logic "O" signals in the register positions. The embedded data selector is also used to provide register personalization, i.e., D registers, J-K registers, multiple generator registers, etc. The data shifted during testing is inverted between each bit and can be used with the reset logic to pinpoint path failures. With respect to the register files, these files are edge-triggered and contain master latches for both data and write address input signals and also contain an array of slave registers. The register files also include an embedded data selector selecting normal data input signal mode, a mode permitting a selected file or file position sequence as a shifting apparatus and a mode providing a reset for entering logic "O's" in the register positions. Embedded data selectors are also used to provide register file input personalization. The shift configuration provides for inversion between each bit and can be used to identify shift path failures. An embedded data selector is also used before the write address master latches and before the read address decode logic apparatus. These data selectors can be used to insert an alternate test address wherein the in test shift or test reset modes allow the signals at a particular register address to be reset to logic "O" signals or inserted into the shift path.

The operation of the test and maintenance system of the instant invention can be understood in the following manner. The system allows the loading and the unloading of all the registers and register files including the auxiliary shift register and the control shift register 35. Thus, any arbitrary initial state can be imposed on the apparatus of the data processing system by shifting predetermined signals into the registers and register files of the data processing system and, thereupon, proceeds with normal operation. Similarly, the present state of the data processing system can be determined by shifting the resident logic signals out of the registers and register files into the maintenance computer for analysis. While the data is being shifted, and each logic signal is inverted between each serial bit position so that, when used in conjunction with the synchronous reset of the register and register files, errors in the shift path can be identified.

The test system of the preferred embodiment can allow the following modes of operation shown in Table 1 by loading address and control shift signals into the control shift register.

TABLE I MODES OF OPERATION OF THE TEST SYSTEM

1. Reset target apparatus.
2. Reset cabinet apparatus.
3. Enable clock signals to target apparatus.
4. Enable clock signals to cabinet apparatus.
5. Shift target apparatus signals into the maintenance data processing system for display and/or alternation.
6. Enable clock signals to cabinet apparatus until an alarm is detected (error condition or maintenance stop an address and/or data). This mode requires an auxiliary shift register load.
7. Transmit alarm signal to maintenance data processing system.

In the preferred embodiment, the component assemblies are implemented by micropacks, each micropack having a plurality of elements. Each board has a multiplicity of micropacks associated therewith, and provides a logical entity for purposes of test signal and clock signal distribution. Similarly, a plurality of boards is associated with each cabinet of the processing system and provides a logical entity for distribution of test signals and clock signals to the associated boards. It will be clear that a different hierarchy of signal distribution will be possible without departing from the scope of the invention.

Referring again to FIG. 9, a block diagram of devices included in a micropack for the test and maintenance apparatus is shown. Except for the clock signal distribution which is also necessary for the normal data processing operation, the signals shown as being applied to the devices of the component assembly are those utilized for the test and maintenance procedures. The test shift signals cause the register signals to be shifted in a serial manner by the clock signals. The component assembly enable signal provides that only the designated component assembly will have clock signals applied thereto. Referring to FIG. 10, the test terminals of the data selectors are coupled to the inverse signal output terminal of the preceeding slave element and test input signals can be clocked by clock generator logic 106 in a serial fashion through each register array and become the test output signals i.e. of slave 105 inverse signal terminals. The test reset signals cause the data select logic to activate the "O" terminal thereby providing a mechanism for initializing the register (i.e. placing a logic "O" in each register position).

In order to save the amount of interconnections and to minimize the addressing apparatus, a plurality of registers, typically a majority of the registers in a component assembly, are coupled serially. Thus all registers 91-96 are serially coupled, but signals are transferred along the serial path only in the test and maintenance mode, i.e. by application of a test shift signal, component assembly enable signals and clock signals. It will be clear that the signals shifted into the registers are available for use in the normal operation of the data processing system.

In the preferred embodiment, many of the registers are in fact register files with a plurality of cells at each register position. The register file select signals (of FIG. 9) select the file to be addressed in the test and maintenance mode. Referring to FIG. 11, the register file select signals are applied to data select logic 118 and, when the test shift signal is present, to the clock generator, write decode, master address latches 116 and through data select 119 to read decode 117. The register file select signals provides for the function that data from the master is applied to the designated one of the four slave cells, and that the data from that slave cell is applied to the data select logic (i.e. 131-135) on a clock signal. The test shift signal provides that the test terminal of data select 111-115 has been activated and because of the coupling from the output data select logic (i.e. 131-135) of each register position, test input signals will be shifted through the register at the chosen slave cell. Similarly, the test reset signals are controlled by the register file select signals. It will be clear that the register file select signal can be manipulated so that the particular slave cell addressed can be altered with each clock cycle by altering counter 40, thereby providing a convenient mechanism of addressing the files of a register.

The test input signals are distributed to the components via the cabinet select 120 and board select logic 132 circuits. Referring to the cabinet select logic 120 of FIG. 6, the test input signals are a series of binary signals capable of providing the initial condition for the selected serial register mode of the component assembly and applied along a single signal path. The cabinet select signals (i.e. address signals) and the command signals can be applied along a plurality of signal paths. Upon selection of the cabinet, signals are transferred to board select logic 132 of the selected cabinet as shown in FIG. 7. The test input signals are applied to all the component assemblies via register 31, while component assembly select signals determine to which component assembly the test input signals will be entered. The board select signals, component select signals and register file select signals are imbedded in the test input signals along with mode control and other signals. The test input signals that are applied to the registers of the component assembly in the serial test mode after test input signals have been shifted into the control shift register 35, that include address and control signals. In order to increase the reliability of the test and maintenance apparatus, each group of test input signals entered in the control shift register 35 includes a plurality of preselected logic signals at preselected positions. If this preselected code is not present in the control shift register, then data can be entered into either the auxiliary shift registers, counter 40 or control shift register buffer 41. This mechanism limits the amount of unreliable data entered into the register of the component assembly. The alarm signals share the test output signal coupling members when the serial register shifting is not occurring and are applied to the maintenance data processing unit 101 as part of the test output signals to indicate the presence of a preselected conditions. A cell is available in the control shift register 35 for each logic board. In addition, activation of any alarm cell will activate the most significant position of the control shift register (and a signal is passed to the maintenance data processing unit 101) upon identification of an alarm cell for any board. By shifting the shift control register 35 contents to the maintenance data processing unit 101, the particular board producing the alarm signal can be identified. Similarly, the test output signals, i.e. signals stored in the registers of the component assembly in a serial mode are transferred, under control of the maintenance data processing system 101, through test output signal select logic 83, register 31 and register 21 to the maintenance data processing system 101.

Important to the operation of the invention is the distribution of the clock or timing signals as a processing system utility, similar to the distribution of power from the power supply. The clock signal apparatus has associated therewith logic to permit the distribution of the clock signals to be controlled by the maintenance data processing system 101. The maintenance data processing system can thereby control the shifting of the test input signals and the test output signals in the individual components. In addition, because the component assembly clock signals can be controlled, the actual operation of the component assemblies can be controlled. Similarly, the test input signals receive distribution throughout the data processing system. However, only the signal-designated boards and/or component assemblies will actually have the register signals shifted in the serial mode.

Referring to FIG. 7 and FIG. 8, apparatus for transferring signals in an auxiliary shift register is indicated. The auxiliary shift register is a group of register cells that store status information and/or control information. As an example of status information, a register cell can store the detection of a parity error. As an example of control information, a register can store a series of signals which when detected by apparatus of the component assembly, can result in a specified response, e.g. a branching operation. In each component assembly, these types of registers, in addition to the normal operational coupling of the data processing mechanism, are coupled in a serial manner. In this serial register, signals can be shifted into or out of the auxiliary shift register while the component assembly is engaged in normal operation. Expressed in a different way, the auxiliary shift register provides for the individual component, the functionality of apparatus normally associated with a maintenance computer. That is, the status of the component, especially error condition information, can be extracted and selected condition information can be entered in the component assembly. The auxiliary shift signals are transferred on the test input and test output signal connections. However, the register cells are shifted on the serial path only upon application of the shift auxiliary shift register signal. The cells of the auxiliary shift register are buffered from the normal component assembly register cells so that data can be transferred without affecting the normal operation of the data processing system. The signals are transferred from/to the normal component assembly register cells to/from the auxiliary shift register cells in response to the auxiliary shift register transfer signal.

Thus, for each component assembly, apparatus is available to shift signals into each register cell (i.e. test input signals), or to shift signals out of each register cell position (i.e. test output signals). The test input signals are determined by programs stored in the main memory storage unit 106 or applied by the terminal device and are entered under the control of the data processing unit 107. Similarly under control of the data processing unit, the test output signals can be withdrawn from the register cells and applied to the data processing unit 107. Thus, by addressing each component, the state of the registers for any arbitrary portion or from data processing system 103 can be established. Similarly, the state of any portion or of all of the registers can be determined by extracting the signals stored therein. Furthermore, because the clock is also under control of data processing unit 107, operation of the machine can be controlled. Thus, data processing system 103 can have an arbitrary state applied thereto after entering the appropriate test input signals, can provide any number of clock signals, and after applying the appropriate control signals can extract signals stored in the registers. The procedure can be utilized, where necessary, to analyze the operation of the data processing system in a step-by-step manner or a limited portion of the data processing system can be similarly tested.

The figures show the apparatus necessary to understand the test and maintenance apparatus. It is clear that coupled to the register cells of the data processing system are a multiplicity of logic and transmission components that are not shown. These logic and transmission components are the apparatus implementing data processing operations, but these components are not necessary for a description of the instant invention.

The use of the test and maintenance apparatus to verify the operation of a preselected signal path can be understood in the following manner. In the test-mode, the test and maintenance apparatus stores predetermined data signals in register cells 171–173, 175, 176–177 and 179. The data signals applied to register cell 175 and 179 are such that during accurate operation of the signal path 180 of the data processing system, the data signal in register 179 will assume the opposite logic state in one clock period. However in general, the signals in other register cells 176 through 177 can be coupled to signal path 180 and 182. Logic gate and transmission member array 182 can consist, as with signal path 180 of logic components, transmission member, media delay etc. The coupling of array 182 with signal path 180 can be, for example, by means of coupling to an input terminal of a logic gate. It will be clear that the data signals stored in register cells 176–177 can affect the signal applied to register cell 179. Therefore, the signals entered in register cells 176–177 are chosen so that no influence is exerted on the data signals of the signal path 180. Similarly, register cells 171–173 are coupled through logic gate and transmission member array 181 to register cells 175 and 176–177. Should register cells 175 or any of register cells 176–177 change state during the clock period, then the data signal in register cell 179 can be compromised. Therefore, the data signal stored in register cells 171–173 are chosen so that during the operation (i.e. one clock period) the signals in register cells 175 and 176–177 are not changed.

The procedure can be summarized in the following manner. The appropriate signals are applied to the register cells 171–173, 175, 176–177 and 179 by test input signals when the register cells are in the serial configuration. A clock period is applied to the apparatus in the normal processing configuration, and the resulting signals in the register cells are transferred from the apparatus as test output signals. The test output signals can be examined to establish that the logic signals in register cell 175 and 176–177 did not change logic state and to determine if the logic signal in register cell 179 did change logic state. By this procedure, the determination can be made that the appropriate signal can be propagated along signal path 187 during one clock period. Every signal path can be tested in this manner.

The above described procedure has been presented as if the register cells 171–173, 175, 176–177 and 179 and the logic gates and signal transmission members 180 and 182 are part of a single component assemblage. It will be clear that this limitation is not necessary. Because all of the register cells of the data processing system, whatever the component assemblage, are accessible to the test and maintenance apparatus, and can have stored therein a predetermined set of logic data signals. It is necessary that the state of the logic signal stored in register cell 175 should cause the state of the logic signal in register cell 179 to change and that the state of all the other register cells coupled to register cells 175 and 176–177, capable of influencing the state of the logic signal in register cell 179, have logic signals stored therein that do not cause the register cell 179 logic signal state to change during a single clock period. The logic signal state of register cells 171–173 are predetermined so that the state of the logic signals in register cells 175 and 176–177 do not change during the clock period.

Using the test and maintenance apparatus disclosed above, it is possible to test a signal path having a plurality of clock periods for transfer of a data signal between register cells. Because the number of register cells influencing the signal path increases rapidly, the difficulty in chosing appropriate data signals for storage in register cells becomes complicated. Furthermore, when an error is detected with the procedure, then the components of the signal path must be investigated to locate the signal path error.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Apparatus for verifying the operation of a data processing system, comprising:
    (a) maintenance means, having a maintenance processor and a maintenance memory, for controlling the execution of a test operation of the data processing system;
    (b) coupling means for coupling the maintenance processor to the data processing system;
    (c) test control means, operatively connected to said coupling means, for controlling the distribution of an input test signal, the distribution of a plurality of control signals, and the distribution of a clock signal to said data processing system; and
    (d) register means, operatively connected to said test control means, said register means being associated with the data processing system, said register means including:
        (i) at least one register of a master/slave type having at least one register position, the register having data select logic before a master latch associated with said register which can select normal input, configure the register as a shifting register, or reset the register in response to one of said control signals; or
        (ii) at least one register file having a plurality of registers of at least one register position, and further having a master latch, a slave register, and a data selector for each of the plurality of registers, the data selector selecting a normal input mode, a shifting mode, or a reset mode in response to one of said control signals;
        preselected register means being placed in the shifting mode in response to one of said control signals, the input test signal being shifted through the preselected register means in response to a shift control signal, the input test signal being analyzed by the maintenance processor after the input test signal has been shifted through the preselected register means to determine if the input test signal has an expected result, the shifting configuration of said register means providing for inversion between each register position wherein each bit of the input test signal is inverted as it is shifted, thereby permitting the analysis to identify a shift path failure.

2. An apparatus according to claim 1 wherein the registers of said register means include D registers, J–K registers, and multiple generator registers.

3. An apparatus according to claim 1 wherein the register files of said register means include a plurality of m×n register files, where m is the number of bit positions of a register within the register file, and where n is the number of registers within the register file.

* * * * *